United States Patent [19]
Pavlin

[11] Patent Number: 5,099,302
[45] Date of Patent: Mar. 24, 1992

[54] INTEGRABLE ACTIVE DIODE

[75] Inventor: Antoine Pavlin, Aix en Provence, France

[73] Assignee: SGS-Thomson Microelectronics, S.A., Gentilly, France

[21] Appl. No.: 630,742

[22] Filed: Dec. 20, 1990

Related U.S. Application Data

[63] Continuation of Ser. No. 406,100, Sep. 12, 1989, abandoned.

[30] Foreign Application Priority Data

Sep. 14, 1988 [FR] France ................. 88 12297

[51] Int. Cl.5 .......................................... H01L 27/02
[52] U.S. Cl. ................... 357/42; 357/23.13; 357/48; 357/52; 357/86
[58] Field of Search .............. 357/23.13, 42, 48, 52.86

[56] References Cited

U.S. PATENT DOCUMENTS

| | | | |
|---|---|---|---|
| 3,940,785 | 2/1976 | Genesi | 357/48 |
| 4,066,918 | 1/1978 | Heuner et al. | 357/56 X |
| 4,303,958 | 12/1981 | Allgood | 357/42 |
| 4,514,646 | 4/1985 | Ando et al. | 357/23.13 |
| 4,805,008 | 2/1989 | Yao et al. | 357/48 |
| 4,857,985 | 8/1989 | Miller | 357/48 |

FOREIGN PATENT DOCUMENTS

| | | | |
|---|---|---|---|
| 0236200 | 2/1987 | France. | |
| 60-217658 | 10/1985 | Japan | 357/23.13 |

Primary Examiner—Edward J. Wojciechowicz
Attorney, Agent, or Firm—Lowe, Price, LeBlanc & Becker

[57] ABSTRACT

An active diode for protecting from reverse voltages a monolithic structure comprising a logic portion and a power portion of the vertical MOS transistor type. The logic portion is constituted by conventional MOS transistors (TL-1) placed in a well (b 64) of a first conductivity type formed in a substrate (60) of the second conductivity type, the rear surface (74) of the substrate corresponding to the drain of the vertical MOS transistor. The active diode comprises a MOS transistor (TS), the gate of which (65) is controlled by a voltage whose sign is representative of the supply voltage polarity, the drain region of which (67) is grounded, and a highly doped deep area (71) of the first conductivity type extending from the upper surface (69) of the well (64), said area being connected to the source (66) of the MOS transistor.

16 Claims, 3 Drawing Sheets

INTEGRABLE ACTIVE DIODE

This application is a continuation of application Ser. No. 07/406,100 filed Sept. 12,1989, now abandoned.

BACKGROUND OF THE INVENTION

The present invention relates to a reverse voltage protection device for a logic circuit; more particularly, it applies to such a protection device for a chip comprising a logic portion and a power portion of the MOS vertical transistor type.

FIG. 1 shows an electric circuit diagram comprising a voltage source 1, for example a car battery, a power switching portion 2 and a logic portion 3. The power switching portion 2 permits to feel a loan L. The logic portion 3 is provided with external inputs 4. A zener diode, not shown in the figure, is generally connected in parallel with the voltage source. This zener diode permits clipping of the voltage when the voltage source supplies a forward current.

The protection of the logic circuit 3 against reverse voltages has to be ensured by a diode 5. This diode is placed outside of the logic portion 3. It would be very advantageous that diode 5 be part of the same integrated circuit as the logic portion 3.

FIG. 2 is a section view of an exemplary conventional dual structure wherein the power portion is schematically represented by a vertical diffused power MOS transistor (VDMOS) TP and the logic portion by a lateral MOS transistor TL.

The structure is realized in a substrate 11 of a first conductivity type, for example of the N-type. A cell of the power MOS transistor TP comprises a region 9-1, 9-2 constituted by diffusions of a second conductivity type, for example of the P-type. In each region 9-1, 9-2, are realized two N+-type diffusions 14 which constitute the power transistor source. The two diffusions 14 are interconnected by a conductive layer 15 which is for example made of aluminum. The lateral edges of regions 9-1, 9-2 constitute a channel region 20 of the power transistor.

Each cell of the power MOS transistor TP comprises a gate 12 formed by a polycrystalline silicon layer. This gate 12 is separated from substrate 11 by an oxide layer 13.

The rear surface 17 of substrate 11 comprises an overdoped layer 19 coated with a drain metallization 18.

The MOS transistor TL of the logic portion is formed in a P-type well 24. This well 24 comprises two N+-type diffusions, the first diffusion constituting the source 22 and the second diffusion constituting the drain 23 of transistor TL. This transistor comprises a gate 21 constituted by a polycrystalline silicon layer. Gate 21 is separated from well 24 by an oxide layer 25. Each diffusion constituting the source 22 and the drain 23 is connected to a conductive line referenced 26, 27, respectively. Those conductive lines 26, 27 are for example made of aluminum.

Conventionally, there is provided in well 24 a P+-type area 28 connected to a conductive layer 29. Area 28 and the conductive layer 29 permit to ground well 24.

In order to realize an integrated protection diode for the logic circuit in a structure of the type shown in FIG. 2, the solution illustrated in FIG. 3 could be envisaged.

FIG. 3 shows the logic transistor TL formed in a well 24 which comprises a diffusion constituting the source 22 and a diffusion constituting the drain 23 of the transistor. The transistor also includes a gate 21.

In this structure, the P+ area 28 shown in FIG1. 2, is replaced by an N+- type area 41. This structure thus exhibits a diode 42 at the junction between the P-type well 24 and area 41.

This diode 42 ensures the protection of the logic portion 3 against reverse voltages. However, this configuration presents several drawbacks.

First, the ground level is shifted by a voltage corresponding to the voltage drop across the terminals of a forward biased diode. This voltage drop $V_F$ has a typical value of 0.7 volt. For example, in case of a TTL-type logic having two states "0" and "1", the logic level "0" corresponds to a voltage lower than 0.4 volt and the logic level "1" corresponds to a voltage higher than 2 volts. With a 0.7 volt difference, level "0" corresponding to the configuration shown in FIG. 3 will not be compatible with level "0"of the TTL logic.

A second drawback is due to the fact that diode 42 is in fact realized by the emitter-base junction of an NPN parasitic bipolar transistor, the collector of which is constituted by the N-type layers 11, 19, the emitter is constituted by area 41 and the base is constituted by well 24, the base not being connected to a defined voltage.

This NPN parasitic bipolar transistor with a floating base exhibits a poor breakdown voltage (a breakdown voltage lower than that of the power MOS transistor TP). Thus, when the power MOS transistor is at the blocked state, the occurence of a high voltage across the terminals of the voltage source will cause the breakdown of the NPN parasitic bipolar transistor before that of the power MOS transistor TP.

SUMMARY OF THE INVENTION

The present invention provides for a new structure permitting to realize a protection device, or protection active diode, intergrated in the logic portion. According to the invention, the protection active diode against reverse voltages of a logic portion included in a monolithic structure which comprises a logic portion and a power portion of the vertical MOS transistor type and which is connected to a supply voltage source, the logic portion being constituted by conventional MOS transistors placed in a well of a first conductivity type formed in a substrate of the second conductivity type, the rear surface of the substrate corresponding to the drain of the vertical MOS transistor, this well comprising an upper surface, the protection active diode being realized in said well, comprises a MOS transistor, the gate of which is controlled by a voltage whose sign is representative of the current voltage polarity, the drain region of which is grounded, and a highly doped deep area of the first conductivity type extending from the upper surface of the well, said area being connected to the MOS transistor source.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1, already described, shows an electric circuit diagram comprising a power switching portion and a logic portion to be protected;

FIG. 2, already described, is a section view of an exemplary conventional dual structure wherein the power portion is schematically shown in the form of a cell for a power MOS transistor of the vertical diffused type (VDMOS) and the logic portion by a MOS transistor;

FIG. 3, already described, is a section view of a structure wherein a first method for realizing a protection device integrated in the logic portion is shown;

DETAILED DESCRIPTION OF THE INVENTION

Generally speaking, as is conventional in the field of the integrated circuit representation, it will be noted that the various drawings are not drawn to scale either inside one figure or from one figure to the other, and in particular the thicknesses of the various layers are arbitrarily drawn in order to facilitate the legibility of the drawings.

Figure 4:
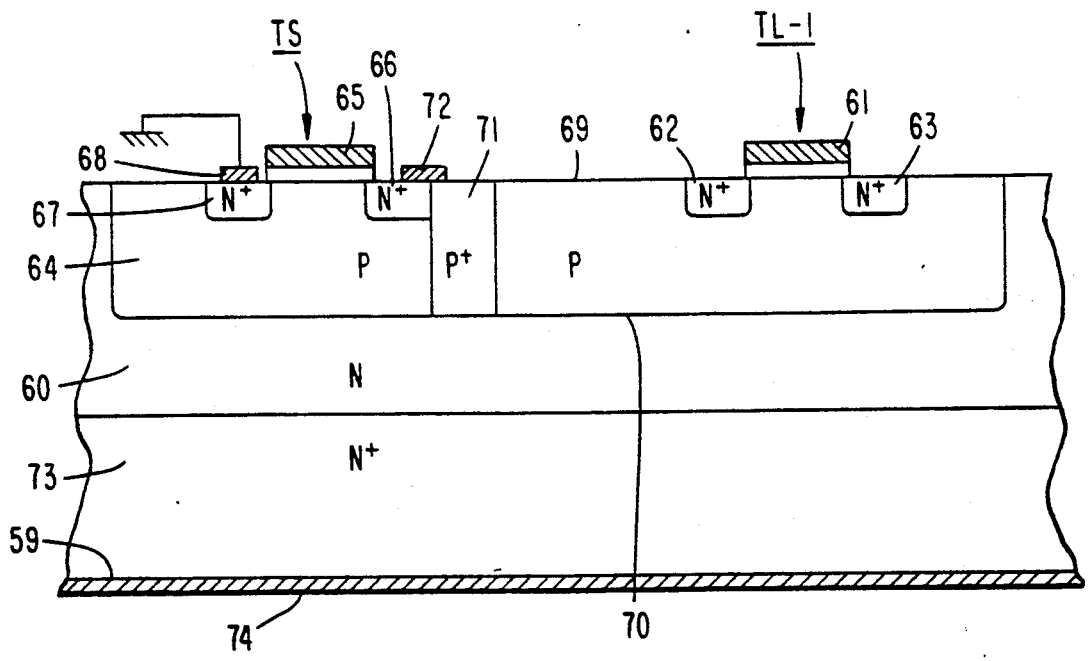
FIG. 4 is a section view of a structure implementation according to the invention wherein a protection device is integrated in the logic portion.

FIG. 4 is a section view of the implementation in a substrate 60, besides comprising a vertical MOS transistor, of a structure according to the invention. The rear surface of substrate 60 comprises an overdoped layer 73 coated with a metallization 74. A conventional MOS transistor TL-1 comprises a gate 61 formed by a polycrystalline silicon layer and source region 62 and drain region 63 which are formed by an N+-type diffusion. Transistor TL-1 is positioned with other control circuit transistors in a P-type well 64.

A MOS transistor TS comprises a gate 65 formed by a polycrystalline silicon layer and source region 66 and drain region 67 formed by an N+-type diffusion, this transistor TS being placed in the same well 64 as transistor TL-1. A conductive layer 68, made for example of aluminum, is connected to the drain region 67 and permits to ground this drain region.

Well 64 exhibits an upper well surface 69 and a lower well surface 70 which is positioned betwen the well and the substrate 60. A highly dopes P+-type area 71 is formed from the upper well surface and is connected to the source region 66, through a conductive layer 72, made for example of aluminum. THis area 71 can extend down to the lower well surface 70 as shown.

Figure 1:
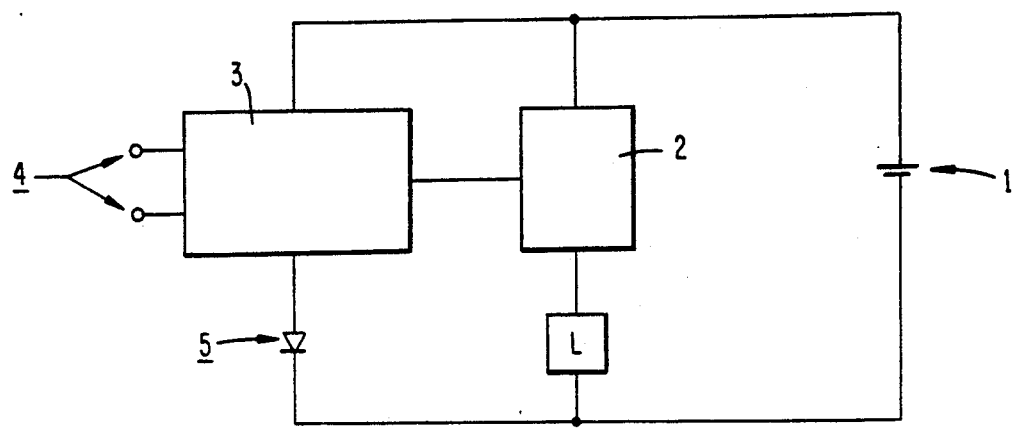
Figure 2:
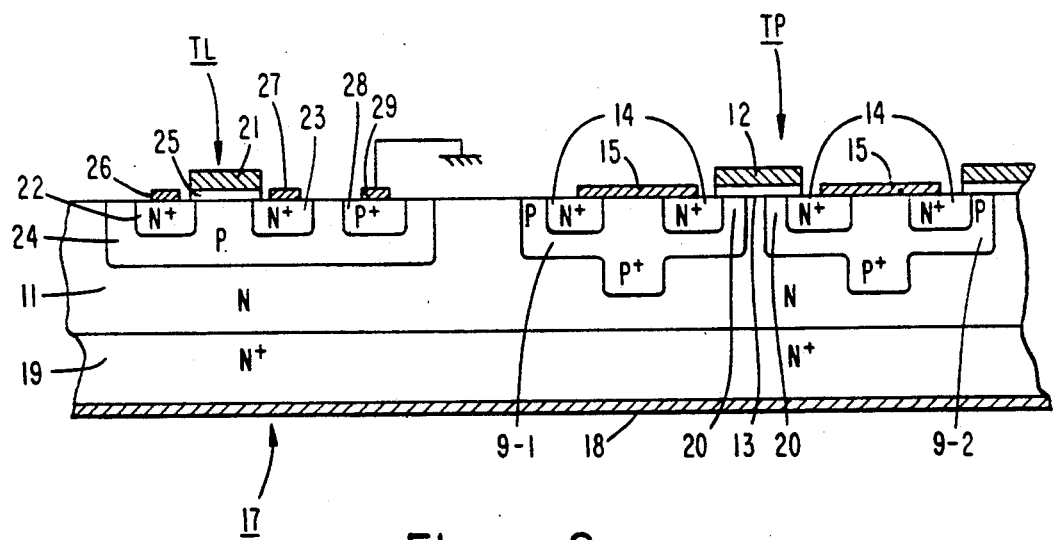
Figure 3:
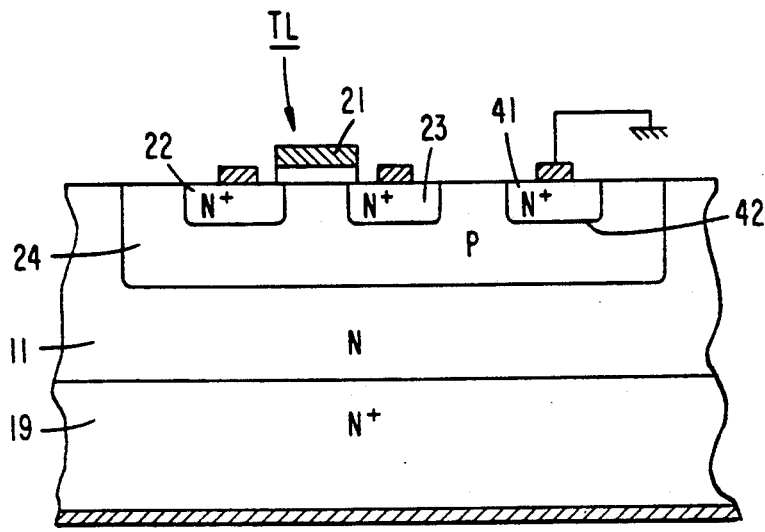

In this structure there is an NPN-type bipolar transistor, the emitter of which is constituted by the drain region 67 of transistor TS, the base by well 64 and the collector by the drain layers 60, 73 of the vertical power MOS transistor (see FIG. 2).

Transistor TS and the NPN bipolar transistor constitute the protection device according to the invention.

Figure 5A:
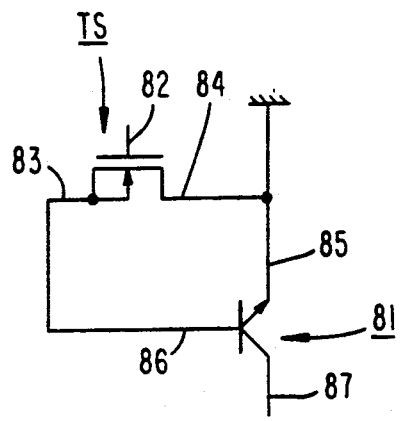
FIGS. 5A, 5B and 5C show electric circuits equivalent to the protection device shown in FIG. 4.
Figure 5B:
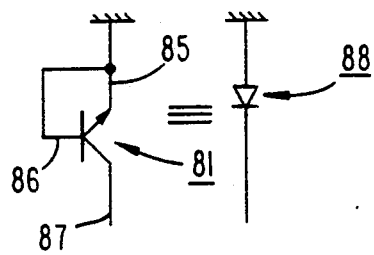
Figure 5C:
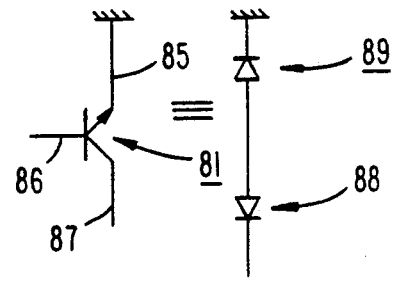

FIGS. 5A, 5B and 5C show electric circuit diagrams equivalent to the protection device shown in FIG. 4. In these figures, the NPN bipolar transistor of the structure shown in FIG. 4 is referenced 81. The gate of transistor TS is referenced 82, the source 83 and the drain 84. In FIGS. 5A, 5B and 5C, the emitter of the bipolar transistor NPN is referenced 85, the base 86 and the collector 87.

Transistor TS is liable to have two states depending upon the sign of the voltage applied to its gate.

Should the voltage applied on its gate be positive, transistor TS is in the conductive state. This case in shown in FIG. 5B. The base 86 and the emitter 85 of the bipolar transistor 81 are then connected. The bipolar transistor 81 is equivalent to a diode 88 which is constituted, as can be seen in FIG. 4, by the well 64 and the substrate 60. The well is then connected to the ground potential.

Should the voltage applied on its gate be negative, transistor TS is in the blocked state. This case is shown in FIG. 5C. The base 86 of the bipolar transistor is not connected to any determined voltage. The bipolar transistor 81 is equivalent to two diodes 88 and 89, diode 88 being constituted, as in case of FIG. 5B, by well 64 and substrate 60, and diode 89 being constituted by well 64 and drain region 67. Diode 89 permits to protect the logic portion of the circuit.

By applying a negative voltage on the gate of transistor TS only in case of polarity reversal on the terminal of drain 74, it is then possible to obtain either a connection of the well to the ground when the polarity is adequate or the insertion of a protection diode during a polarity reversal.

Figure 6:
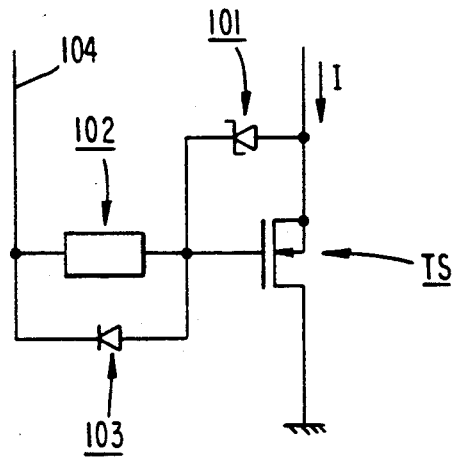
FIG. 6 shows an electric circuit of a protection device control system.

FIG. 6 shows an electric circuit diagram of an exemplary control circuit for the protection device shown in FIG. 4. This control circuit comprises a zener-type diode 101, connected between gate and source of transistor TS, a high value resistor (a typical value for resistor 102 is 1 megohm) and a diode 103 in parallel, connected between the transistor gate and a terminal 104. Terminal 104 is connected to the drain of the power MOS transistor, that is, normally to the positive terminal of the current.

Should the voltage applied on the gate of the MOS transistor TS be positive, transistor TS is in the conductive state. Zener diode 101 permits to limit the gate-source voltage of the MOS transistor TS. The logic portion uses a current I which flows through transistor TS. If the polarization of the voltage source is reversed, the voltage applied on the gate of transistor TS is negative, the transistor is in the blocked state. The case of FIG. 5C where diode 89 ensures the protection of the logic portion is again encountered.

When an abrupt polarization reversal occurs while the circuit was operating in a d-c mode with a positive voltage applied on the gate of the MOS tansistor TS, the latter has to be very rapidly switched off so as to ensure the protection of the logic portion. This switching off is made possible owing to the presence of diode 103 which permits a very fast discharge of the gate of transistor TS.

It is also mandatory that transistor TS be set again in conductive state only some time after the voltage applied on the gate of transistor TS has become positive anew. This permits to filter out the high frequency oscillations when the supply voltage approaches 0 volt. This is achieved with resistor 102 which introduces a charging time constant t for the gate of transistor TS. With a resistor value of about 1 megohm, the charging time constant t will have a value of about 5 microseconds.

I claim:

1. A semiconductor device having reverse power supply polarity protection, comprising:
    a semiconductor substrate of a first conductivity type having a lower layer having a high impurity concentration and an upper layer on said lower layer, said upper layer having an impurity concentration lower than said high impurity concentration of said lower layer;

a well region of a second conductivity type opposite said first conductivity type and of a first impurity concentration, said well region formed in said upper layer of said semiconductor substrate and having a predetermined depth;

a vertical first MOS transistor formed in said semiconductor substrate outside said well region, said vertical MOs transistor including source and drain regions of said first conductivity type formed respectively in said upper and lower layers of said substrate, said source and drain receiving an operating voltage therebetween having a particular polarity;

a highly doped region of said second conductivity type having a greater impurity concentration than said impurity concentration of said well region, said highly doped region formed in said well region and having no greater than said predetermined depth therein;

a second MOS transistor formed in said well region, said second MOS transistor having first and second spaced apart source/drain regions of said first conductivity type formed in said well region, a channel region located between said source/drain regions, a gate oxide region formed on said upper layer of said semiconductor substrate above said channel region and a gate electrode formed on said gate oxide region, said first source/drain region formed adjacent and electrically connected to said highly doped region, said second source/drain region connected to ground; and means for applying, to said gate electrode of said second MOS transistor, a voltage having a polarity corresponding to said particular polarity of said operating voltage.

2. A semiconductor device according to claim 1, wherein said gate electrode of said second MOS transistor is connected to a resistor and a diode together connected in parallel for supplying a control signal to said second MOS transistor.

3. A semiconductor device according to claim 1, further comprising a zener diode connected between said gate electrode and said second source/drain region of said second MOS transistor.

4. The semiconductor device of claim 1 further comprising a metal layer formed on said upper layer of said semiconductor substrate, said metal layer electrically connecting said first source/drain region of said second MOS transistor to said highly doped region.

5. The semiconductor device of claim 1 wherein said highly doped region extends throughout said predetermined depth of said well region.

6. A semiconductor device having reverse power supply polarity protection, comprising:

a semiconductor substrate of a first conductivity type having upper and lower main surfaces;

an overdoped layer of said first conductivity type and having an impurity concentration greater than an impurity concentration of said semiconductor substrate, said overdoped layer formed on the lowe main surface of said semiconductor substrate;

a well region of a second conductivity type opposite said first conductivity type formed in said semiconductor substrate and having a predetermined depth;

a vertical first MOS transistor formed outside said well region, said first vertical MOS transistor including a source region formed in said semiconductor substrate and a drain region formed in said overdoped layer, said source and drain regions receiving an operating voltage therebetween having a particular polarity;

a highly doped region of said second conductivity type having a greater impurity concentration than an impurity concentration of said well region, said highly doped region formed in said well region and having no greater than said predetermined depth;

a second MOS transistor formed in said well region, said second MOS transistor having first and second spaced apart source/drain regions of said first conductivity type and of a higher impurity concentration than said semiconductor substrate impurity concentration, said source/drain regions formed in said semiconductor substrate, a channel region located between said source/drain regions, a gate oxide layer formed on said main surface of said semiconductor substrate above said channel region and gate electrode formed on said gate oxide region, said first source/drain region formed adjacent and electrically connected to said highly doped region, said second source/drain region connected to ground; and means for applying, to said gate electrode of said second MOS transistor, a voltage having a polarity corresponding to said particular polarity of said operating voltage.

7. A semiconductor device according to claim 6 wherein said gate electrode of said second MOS transistor is connected to a resistor and a diode together connected in parallel for supplying a control signal to said second MOs transistor.

8. A semiconductor device according to claim 6, further comprising a zener diode connected between said gate electrode and said second source/drain region of said second MOS transistor.

9. The semiconductor device of claim 6 further comprising a metal layer formed on said upper main surface of said semiconductor substrate, said metal layer electrically connecting said first source/drain region of said second MOS transistor to said highly doped region.

10. The semiconductor device of claim 6 wherein said highly doped region extends throughout said predetermined depth of said well region.

11. The semiconductor device of claim 6 further comprising a metalization layer formed on a main surface of said overdoped layer opposite said semiconductor substrate.

12. A semiconductor device having reverse power supply polarity protection, comprising:

a semiconductor substrate of a first conductivity type having upper and lower main surfaces; an overdoped layer of said first conductivity type and having an impurity concentration greater than an impurity concentration of said semiconductor substrate, said overdoped layer formed on the lower main surface of said semiconductor substrate;

a metalization layer formed on a main surface of said overdoped layer opposite said semiconductor substrate;

a well region of a second conductivity type opposite said first conductivity type formed in said semiconductor substrate and having a predetermined depth;

a vertical first MOS transistor formed in said semiconductor substrate and in said overdoped layer outside said well region, said vertical MOS transistor including a source region formed in said semiconductor substrate and a drain region formed in said overdoped layer, said source and drain regions receiving an operating voltage therebetween having a particular polarity;

a highly doped region of said second conductivity type having a greater impurity concentration than an impurity concentration of said well region, said highly doped region formed in said well region and having no greater than said predetermined depth; and a second MOPS transistor formed in said well region, said second MOS transistor having first and second spaced apart source/drain regions of said first conductivity type formed in said well region, a channel region formed between said source/drain regions, a gate oxide layer formed on said main surface of said semiconductor substrate above said channel region and a gate electrode formed on said gate oxide region, said first source/drain region formed adjacent and electrically connected to said highly doped region, said second source/drain region connected to ground; and means for applying, to said gate electrode of said second MOS transistor, a voltage having a polarity corresponding to said particular polarity of said operating voltage.

13. A semiconductor device according to claim 12 wherein said gate electrode of said second MOS transistor is connected to a resistor and a diode together connected in parallel for supplying a control signal to said second MOS transistor.

14. A semiconductor device according to claim 12, further comprising a zener diode connected between said gate electrode and said second source/drain region of said second MOS transistor.

15. The semiconductor device of claim 12 further comprising a metal layer formed on said upper main surface of said semiconductor substrate, said metal layer electrically connecting said second source/drain region of said second MOS transistor to said highly doped region at said upper surface of said semiconductor substrate.

16. The semiconductor device of claim 12 wherein said highly doped region extends throughout said predetermined depth of said well region.

* * * * *